United States Patent [19]
Abe et al.

[11] 3,939,388
[45] Feb. 17, 1976

[54] SELF-BALANCING INSTRUMENT

[75] Inventors: Eisuke Abe; Kiyonobu Tanaka, both of Musashino, Japan

[73] Assignee: Kabushikikaisha Yokogawa Denki Seisakusho, Tokyo, Japan

[22] Filed: Sept. 26, 1974

[21] Appl. No.: 509,420

[30] Foreign Application Priority Data
Mar. 12, 1974 Japan............................... 49-28732

[52] U.S. Cl. ............... 318/321; 318/631; 318/666; 318/667; 318/678; 324/99 R
[51] Int. Cl.².. G01R 17/06; G05F 1/00; G05B 6/02
[58] Field of Search .......... 318/611, 615, 621, 631, 318/650, 666, 667, 678, 687; 324/99, 100

[56] References Cited
UNITED STATES PATENTS

| | | | |
|---|---|---|---|
| 3,359,472 | 12/1967 | Frank et al. ....................... | 318/667 |
| 3,602,792 | 8/1971 | Engle ................................ | 318/666 |
| 3,697,871 | 10/1972 | MacMullan ....................... | 318/666 |

*Primary Examiner*—Robert K. Schaefer
*Assistant Examiner*—John J. Feldhaus
*Attorney, Agent, or Firm*—Moonray Kojima

[57] ABSTRACT

A multi-range, self-balancing instrument using a Zener diode circuit and a phase compensating circuit is disclosed. The Zener diode circuit is capable of generating a white noise, which is effectively applied to the self-balancing system whereby the dead zone is maintained constant irrespective of the range. The phase compensating circuit, comprising a non-inverting input amplifier, is capable of compensating for the phase lag of the self-balancing instrument by adjusting the amplification factor of the amplifier without affecting the stability of the servo amplifier system.

5 Claims, 8 Drawing Figures

SELF-BALANCING INSTRUMENT

BACKGROUND OF THE INVENTION

1. Field of Invention

This invention relates to self-balancing instruments, and more particularly, to self-balancing instruments of the multi-range type capable of maintaining its dead zone constant and compensating for the phase lag of the instrument.

In self-balancing instruments, it is generally undesirable to have noise present in the self-balancing system. If such noise is exceedingly small, the dead zone usually increases. However, it is also desirable to have a small dead zone. For multi-range type self-balancing instruments, the dead zone should be constant irrespective of the range used.

Also, in self-balancing instruments, hunting usually takes place due to a phase lag caused in the servo system. To prevent this hunting, a phase compensating circuit is usually used with the feedback circuit.

2. Description of the Prior Art

It is well known in the art that a white noise, generated by a Zener diode, may be applied as a dither to a balancing motor in order to reduce the dead zone. In such self-balancing instruments, the white noise is attenuated to a value corresponding to the range used. Hence, the dead zone changes according to the range used. In practice, the dead zone must be small and constant irrespective of the range used. To realize a constant dead zone, the use of a white noise is effective when it is applied as a dither to the balancing motor through a pair of range changing attenuators of which the combined ratio is constant.

To prevent hunting, which is caused by a phase lag in the servo system, a phase compensating circuit may be used with the feedback circuit. The prior art phase compensating circuit comprises a voltage dividing resistor, a capacitor, and a fixed resistor. To introduce an adequate phase lead into the voltage, the brush position on the voltage dividing resistor is suitably adjusted. This type of circuit, however, is impractical because the angular frequency changes with change in the brush position. Thus, building of servosystems is complicated by the difficulty in determining the constants of their components. The importance of the phase compensating circuit, when used in servo amplifier systems, is to increase the response of the servo amplifier system without affecting other characteristics and to simplify construction of servo amplifier systems. Furthermore, phase advancing circuits used for the purpose of phase compensation should not require complex analysis of the characteristics of the constituent elements of the servo amplifier system and the determining of their component element constants.

SUMMARY OF THE INVENTION

It is an object of this invention to provide a multi-range type self-balancing instrument or apparatus in which the dead zone is maintained small and constant irrespective of the range used.

It is another object of the invention to provide a self-balancing instrument having a phase compensating circuit which enables simplified construction of servo amplifier systems.

The foregoing, and other objects of the invention are attained in a multi-range, self-balancing apparatus comprising a voltage generating means having a pair of interconnected variable resistors, a phase compensating means including a noninverting input amplifier, a capacitor, a variable resistor and a first range changing attenuator, a white noise generator comprising a Zener diode, a difference generator means and DC-AC converter means, an output circuit means having a second range changing attenuator, and a balancing motor means. The two attenuators are interconnected so that the combined attenuation ratio is constant. The shaft of the motor is connected to one of the variable resistors of the voltage generating means thereby to control the voltage generated and ultimately applied to the difference generator means, and hence to the motor.

In operation, a standard voltage is obtained across the variable resistors of the voltage generating means and applied to the phase compensating means, wherein the voltage is divided by the attenuator and variable resistor in a ratio corresponding to the range selected. The voltage from the phase compensating means and a measuring voltage are then compared by the difference generator means and a difference signal is produced and converted from DC to AC by the DC-AC converter means. The AC signal is then applied to the output means wherein the signal is attenuated by the second range changing attenuator. The signal is then amplified and applied to the control phase of the motor, which then moves the variable resistor of the voltage generating means until the standard voltage applied to the phase compensating means and generated output voltage is the same as the measuring voltage in the difference generating means. Concurrently, a white noise is generated by the white noise generator means and applied to the input or output terminal of the phase compensating means, and superposed on the standard voltage. The combined signal then is acted upon in the same manner by the difference generator and DC-AC converter, and output means. Because the combined attenuation ratio is constant, the peak to peak value of envelope change in the voltage applied to the balancing motor is constant for all ranges selected. When the envelope variation is a small percentage of the rated value of the control phase voltage of the motor, the mechanical system of the self-balancing apparatus will respond to the low frequency component of the white noise and be constantly "shook" from a static state to a dynamic and thus reduce mechanical stickiness and minimize the dead zone.

A feature of the invention is a particular combination of elements wherein a phase compensating circuit having a non-inverting input amplifier and a voltage divider comprising a resistor and a first range changing attenuator, a white noise generator connected to the input or output terminal of the phase compensating circuit, a difference signal generator and DC-AC converter, and an output circuit having a second range changing attenuator interconnected to the first range changing attenuator to have a constant combined attenuation ratio, and a motor having a shaft connected to a voltage generating circuit, are interconnected in such a manner that a phase compensated voltage is generated by the phase compensating circuit and compared by the difference generator with a measuring voltage and thereupon generates a difference signal which is now in alternating current, and which signal is then attenuated by the second attenuator and applied to the motor which thereupon causes the voltage generator circuit to produce a different voltage to the phase compensating circuit to cause the phase compensated output signal to be equal to the measuring voltage of the difference signal generator, and wherein the white noise from the white noise generator is superposed on the standard voltage which is processed by the phase compensating circuit, difference generator and DC-AC converter, and output circuit, and supplied to the motor, thereby to keep the dead zone small and constant for all ranges selected.

Another feature of the invention is the noise generator comprising a Zener diode, a voltage source, and suitable resistor and which generates a signal which is applied either to the input terminal or output terminal of the phase compensating circuit.

A further feature of the invention is a phase compensating means comprising a non-inverting input amplifier having a variable amplification factor, connected in series to a capacitor and in parallel to a first resistor and the amplifier capacitor also being connected in series with a variable resistor wherein input voltage is divided by the two resistors and the output of the amplifier is superposed on the voltage at the connection between the two resistors and whereby the amplification factor may be adjusted to obtain the desired phase lead for the input voltage.

DETAILED DESCRIPTION OF PREFERRED EMBODIMENTS

Figure 1:
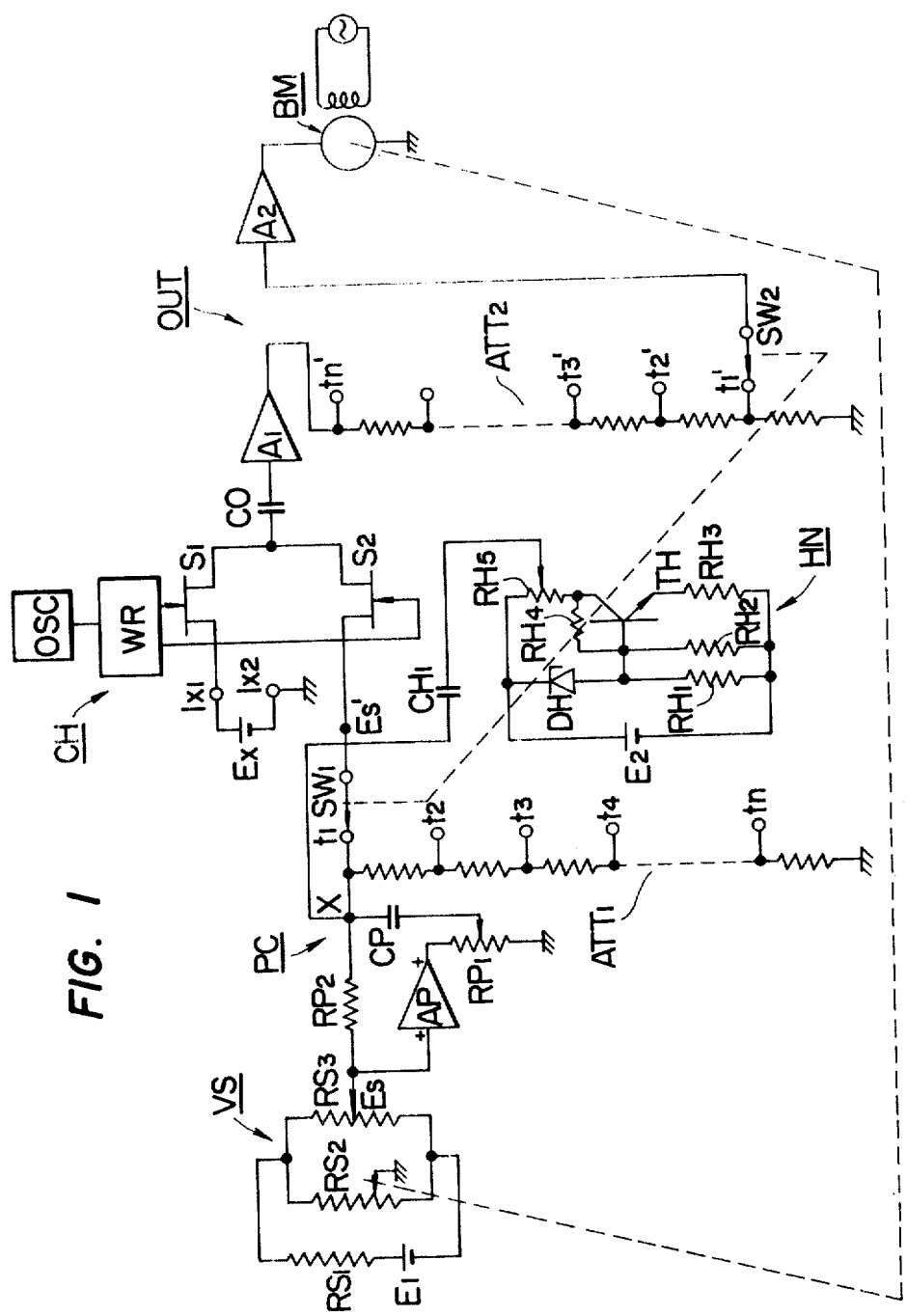
FIG. 1 is a circuit diagram depicting on illustrative embodiment of the invention.

Turning now to FIG. 1, a circuit diagram is depicted to illustrate a self-balancing apparatus of the invention. The illustrative embodiment comprises a voltage generating circuit VS, a phase compensating circuit PC, a white noise generator HN, a difference generator and DC-AC converter circuit CH, an output circuit OUT and a balancing motor BM, all connected together in the manner depicted.

The standard voltage generating circuit VS comprises a constant voltage source E1, a fixed resistor RS1, a slide resistor RS2 interlocked with a balancing motor BM shaft, which will be described hereinafter, and a variable resistor RS3 used when setting the mechanical zero position of a recording pen (not shown), for example. The phase compensating circuit PC is useful for preventing hunting and comprises a non-inverting input amplifier AP, a variable resistor RP1 connected to the output terminal of the amplifier AP, a capacitor CP connected to the brush of the resistor RP1, a resistor RP2 connected between the input terminal of the amplifier AP and the capacitor CP, and a range-changing attenuator ATT1 having one end thereof connected to junction X between the resistor RP2 and the capacitor CP. The amplifier AP has its input terminal connected to the variable resistor RS3 of the standard voltage generating circuit VS. The operation of this phase compensating circuit will be described later in connection with the functions of the circuits of the invention.

The difference signal generator and DC-AC converter circuit CH comprises an oscillator OSC, a waveform shaping circuit WR, and switches S1 and S2 which comprise field effect transistors. The switch S1 is connected to input terminals and 1X1 and 1X2, between which a voltage Ex to be measured is applied. While the switch S2 is connected to the movable contactor of a selector switch SW1. The difference signal generator and DC-AC convertor circuit CH turns on and off the output voltage of the measuring voltage Ex and that of the phase compensating circuit PC, alternately. The resultant output is supplied by way of a DC filter capacitor CO an output circuit OUT in the succeeding stage. The output circuit OUT comprises amplifiers A1 and A2, a capacitor CO which couples the amplifier A1 to the circuit CH, and a range-changing attenuator ATT2 connected between the amplifiers A1 and A2.

The attenuator ATT1 in the phase compensating circuit PC and the attenuator ATT2 in the output circuit OUT, comprise a plurality of resistors. The selector switch SW1 of the attenuator ATT1 is interlocked with the selector switch SW2 of the attenuator ATT2 so that the range may be switched one after another on taps $t_1', t_2', t_3', \ldots$ of the switch SW2 as the range is switched one after another on taps $t_1, t_2, t_3, \ldots$ of the switch SW1. The attenuation ratios of the two multiplied together must equal a constant number. Assume that the attenuation ratio of the attenuator ATT2 is 1/5 or 1/1 when that of the attenuator ATT1 is 1/2 or 1/10. By so determining the attenuation ratios of the two attenuators, the combined attenuation ratio, ATT1 (x) ATT2, is maintained constant, that is in both cases, 1/10. In other ranges also, the combined attenuation ratio is constant. The output of the amplifier A2 is supplied to the control phase of the balancing motor BM. The rotating shaft of the balancing motor BM is interlocked with the brush of the slide resistor RS2 of the standard voltage generating circuit VS.

The white noise generator HN is used to supply the balancing motor BM with a dither. The white noise generator HN comprises a Zener diode DH, a transistor TH, resistors RH1 through RH4, a variable resistor RH5, and a DC voltage source E2.

Figure 3:
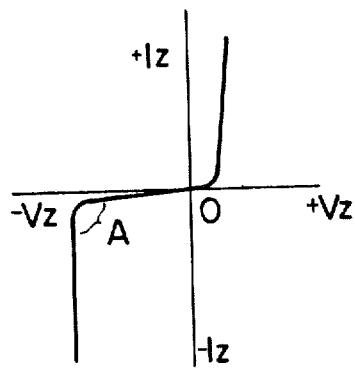
FIGS. 3 and 4 are graphic diagrams, respectively showing the operational characteristics of the Zener diode and the motor.

FIG. 3 shows the voltage vs. current characteristics of the Zener diode DH. It is known that white noise is generated mostly in the electron avalanche region A. The constituent elements of the white noise generator HN are determined so that the Zener diode DH is operated in the electron avalanche region A. The white noise thus generated may be amplified by transistor TH and derived from the brush of the variable resistor RH5 by way of the collector electrode of the transistor TH, and then applied through the capacitor CH1 to the junction X between the attenuator ATT1 and the resistor RP2 of the phase compensating circuit PC.

This self-balancing instrument is operated in the following manner. The standard voltage Es obtained between the brush of the variable resistor RS3 and the brush of the slide resistor RS2 of the standard voltage generating circuit VS is applied to the phase compensating circuit PC in which the voltage Es is divided by the resistor RP2 and atenuator ATT1. The attenuator ATT1 attenuates the voltage Es into a standard voltage Es' in a ratio corresponding to the range selected. The voltage Es' and the measuring voltage Ex are applied to the difference signal generator and DC-AC converter circuit CH, in which the difference between the two voltages in converted into an AC signal. This signal is supplied through the capacitor CO and amplifier A1 to the attenuator ATT2 in which the signal is attenuated in a ratio corresponding to the range selected. Then the signal is amplified by the amplifier A2 and applied to the control phase of the balancing motor BM to cause the motor BM to be driven. The motor BM rotates to move the brush of the slide resistor RS2 of the voltage generating circuit VS, so that the standard voltage Es' becomes equal to the measuring voltage Ex.

Figure 4:
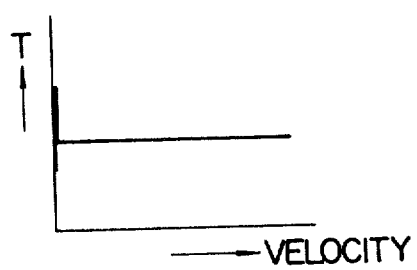

Concurrently, a white noise of a given peak-to-peak value, generated by the white noise generator HN, is derived from the variable resistor RH5 and applied through the capacitor CH1 to the junction X between the resistor RP2 and the attenuator ATT1. The white noise is then superposed on the standard voltage Es, attenuated by the attenuator ATT1, and applied to the attenuator ATT2 by way of the difference signal generator and DC-AC converter CH, capacitor CO and amplifier A1. The signal is attenuated by the attenuator ATT2, amplified by the amplifier A2, and applied to the control phase of the balancing motor BM. Because combined attenuation ratio ATT1 (x) ATT2, is constant in any range as described previously, the peak to peak value of envelope change in the voltage applied to the control phase of the balancing motor BM is constant irrespective of the range selected. When the envelope variation is determined to be several percent of the rated value of the control phase voltage of the motor BM, the mechanical system of the self-balancing instrument will respond to the low frequency component (lower than about 5 Hz) of the white noise. Thus, the mechanical system is "shook" from a static state constantly into a dynamic state, to make it feasible to reduce mechanical stickiness as shown in FIG. 4, and thereby minimize the dead zone of the self-balancing system. In FIG. 4, the abscissa stands for the velocity of the balancing motor BM; and the ordinate stands for the friction torque T viewed by the rotating shaft of the motor BM.

Therefore, according to the invention, a multi-range type self-balancing apparatus in which the dead zone is small and kept constant irrespective of the range used, can be realized. To illustrate the invention more specifically, the phase compensating circuit PC will hereinafter be described in terms of phase advancing circuit in comparison with a prior art equivalent.

Figure 5:
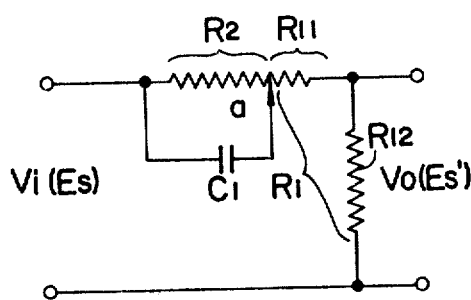
FIG. 5 is a diagram depicting one prior art phase compensating circuit.

Referring to FIG. 5, there is shown a prior art phase advancing circuit wherein the symbol Vi denotes an output voltage from a potentiometer used in the self-balancing system. (This voltage corresponds to the voltage Es between the brushes of resistors RS2 and RS3 in FIG. 1). The voltage Vi is supplied to the phase advancing circuit. The output voltage Vo of the phase advancing circuit serves as the feedback voltage to the self-balancing system. (This voltage corresponds to the voltage Es' in FIG. 1) The symbol C1 indicates a capacitor, and R1, R2, R11 and R12 indicate resistors. The resistors R2 and R11, and a brush "a" constitute a voltage divider. By changing the brush position, the input voltage Vi is given an adequate phase lead. The resultant voltage Vo is fed back whereby the characteristics of the servo amplifier system are improved.

The transfer function G1(S) of the phase advancing circuit of FIG. 5 is given as $$G1(S) = \frac{Vo(S)}{Vi(S)} = \frac{R12}{R1 + R2} \cdot \frac{Td_1 S + 1}{\frac{Td_1}{\alpha_1} S + 1} \quad (1)$$

Wherein $$Td_1 = C1R2; \quad \alpha_1 = \frac{R1 + R2}{R1}; \quad R1 = R11 + R12.$$

Figure 7:
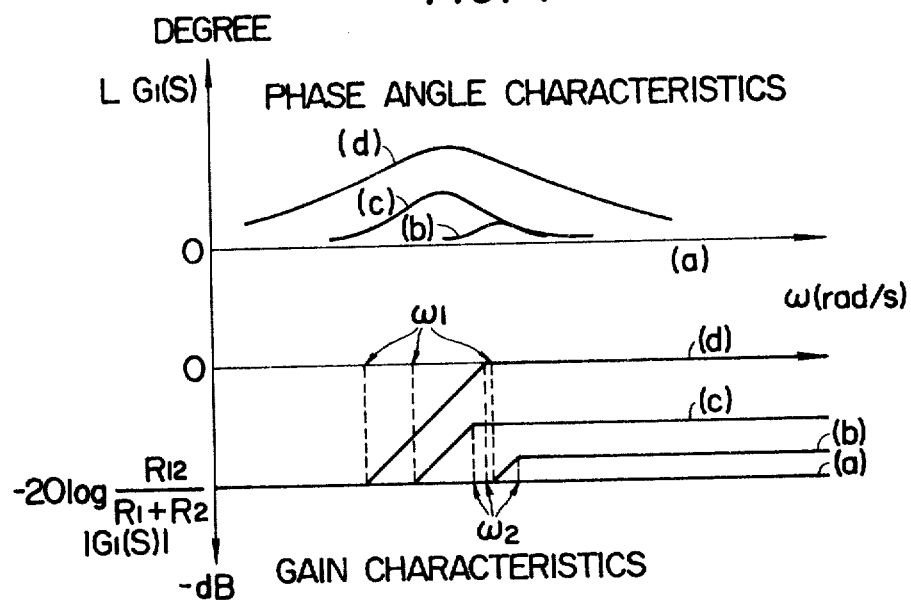
FIG. 7 is a diagram illustrating the operation of the circuit shown in FIG. 5.

The voltage dividing ratio $$\frac{R12}{R1 + R2}$$

is constant regardless of the brush position. However, when the gain characteristic of transfer function G1 (S) is viewed in terms of the Bode diagram, the corner frequency $\omega 1$ (= $1/Td_1$) of the numerator in Equation (1) and the corner frequency $\omega_2$ (=$\alpha_1/Td_1$) of the denominator become variable. FIG. 7 shows the transfer function G1(S) in Bode diagram where the gain characteristic is obtained by segment approximation. FIG. 7 is a semi-logarithmic version of the diagram in which the abscissa represents the angular frequency $\omega$(rad/S) in logarithmic scale in view of the frequency response of the transfer function; and the ordinate represents the gain (dB) and the phase angle (degree). The Bode diagram shows part of gain characteristic and phase angle characteristic depicted when the brush "a" is moved so that the value of R2 is increased from approximately zero. These characteristics change in succession, (a) → (b) → (c) → (d), with the movement of the brush. At the same time, the corner frequencies $\omega_1$ and $\omega_2$ also change. In this manner, the circuit is made able to provide the input voltage Vi with the desired phase lead by adjusting the position of the brush. On the other hand, however, the corner frequencies $\omega_1$ and $\omega_2$ change with the movement of the brush, which necessitates extra consideration when constructing a servo amplifier system, such as determining the constants of its circuit elements.

Figure 6:
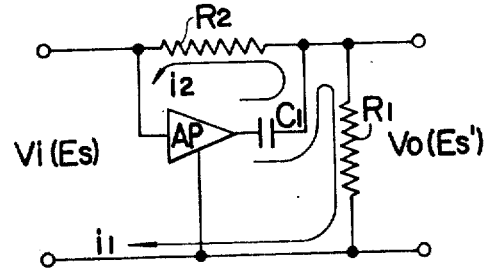
FIG. 6 is a diagram depicting an illustrative phase compensating circuit used in the invention.

An illustrative phase compensating circuit PC, used for the purpose of the invention, is shown in FIG. 6 wherein the symbol R1 denotes a resistor equivalent to the resistor attenuator ATT1 shown in FIG. 1, R2 is a resistor equivalent to the resistor RP2 in FIG. 1 and C1 is a capacitor equivalent to the capacitor CP in FIG. 1. The input voltage Vi is divided by resistors R1 and R2. The symbol AP denotes a non-inverting input amplifier, of which the amplication factor Kp is variable. In FIG. 1, a variable resistor RP1 is connected to the output terminal of the amplifier AP, and its gain is changed by the use of resistor RP1. The amplifier AP, when given the input voltage Vi, generates an output, which is applied to the junction between the first and second resistors R1 and R2. The voltage Vo appearing across the first resistor R1 is the output of the phase advancing circuit. Assume that currents flow as shown inf FIG. 6. Then the following relationships are obtained.

$$KpVi - Vi = \frac{1}{j\omega C1}(i_1 + i_2) + R_2 i_2$$

-continued $$KpVi = \frac{1}{j\omega C_1}(i_1 + i_2) + R_1 i_1$$

$$Vo = R_1 i_1$$

The transfer function G2(S) of the phase advancing circuit is derived from the above equations. Thus, $$G2(S) = \frac{Vo(S)}{Vi(S)} = \frac{1}{\alpha_2} \frac{KpTd_2 S + 1}{\frac{Td_2}{\alpha_2}S + 1} \quad (2)$$

wherein $$Td_2 = C1R2 \text{ and } \alpha_2 = \frac{R1 + R2}{R1}$$

Equation (2) signifies that the DC voltage dividing ratio $1/\alpha_2$ and the corner frequency $\omega_2$ ($=\alpha_2/Td_2$) of the denominator are constant against the amplification factor Kp.

Figure 8:
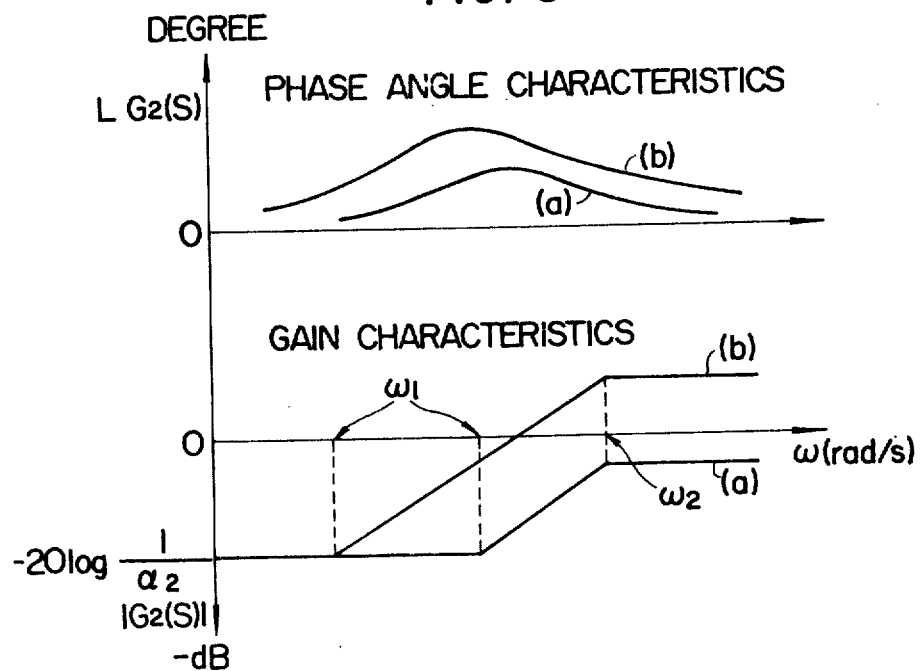
FIG. 8 is a diagram showing waveforms for illustrating the operation of the circuit shown in FIG. 6.

FIG. 8 shows the transfer function G2(S) in Bode diagram drawn in semi-logarithmic expression, in which the abscissa stands for the angular frequency $\omega$ (rad/S) in logarithmic scale; and the ordinate stands for the gain (dB) and phase angle (degree). The transfer function G2(S) as in equation (2) is such that the gain characteristic and the phase angle characteristic change from (a) to (b) by adjusting the amplification factor Kp. (FIG. 8 shows an instance where Kp is increased) This adjustment does not affect the corner frequency $\omega_2$. In order to increase the response of the servo amplifier system, a method is adopted in which the phase at frequencies in the neighborhood of the corner frequency of the loop gain of the servo amplifier system and at frequencies higher than the corner frequency is advanced by the phase advancing circuit and thus the phase margin is widened and the loop gain is increased. In this case, the feedback voltage (equivalent to the input voltage Vi in FIG. 6) to the servo amplifier system is given a phase lead by suitably determining the amplification factor Kp of the non-inverting input amplifier of the phase advancing circuit. Because the corner frequency $\omega_2$ of the gain characteristic of the phase advancing circuit is constant against the amplification factor Kp, the overall characteristic variation is made simpler than according to the prior art approach based on the transfer function G1(S) as in equation (1). Thus, according to this invention, synthesis of servo amplifier systems is much simplified.

As described above, the phase compensating circuit of the invention is of a phase advancing circuit in which the input voltage is divided by resistors and attenuator ATT1 and at the same time is applied to a non-inverting input amplifier of which the amplification factor is variable, the output of the amplifier is superposed on the voltage at the dividing point of the resistor and attenuator through a capacitor, and the amplification factor of the non-inverting input amplifier is adjusted whereby the desired phase lead is provided for the input voltage. This use of this phase advancing circuit in the feedback circuit of the self-balancing system shown in FIG. 1 permits the self-balancing instrument of the invention to offer various advantages, such as (1) The corner frequency $\omega_1$ can be obtained by adjusting the amplification factor in the phase advancing circuit of FIG. 6 where the use of a capacitor of small capacity suffices, as opposed to the prior art circuit which needs a capacitor of large capacity to obtain the desired corner frequency $\omega_1$. In other words, the size of the phase advancing circuit can be reduced, resulting in a compact servo amplifier system.

2. In the phase advancing circuit with the corner frequency $\omega_1$ determined, the value of $$\frac{R1}{R1 + R2}$$

can be brought near 1, if the amplification factor is set to be large enough. That is, the balancing voltage of the servo amplifier system can be used potentiometrically as far as a value in the close proximity of the of the standard voltage of the servo amplifier system. This enhances the feasibility of a multi-range servo amplifier system.

3. Phase adjustment can readily be made only by adjusting the amplification factor of the non-inverting input amplifier without reducing the stability of the servo amplifier system.

Figure 2:
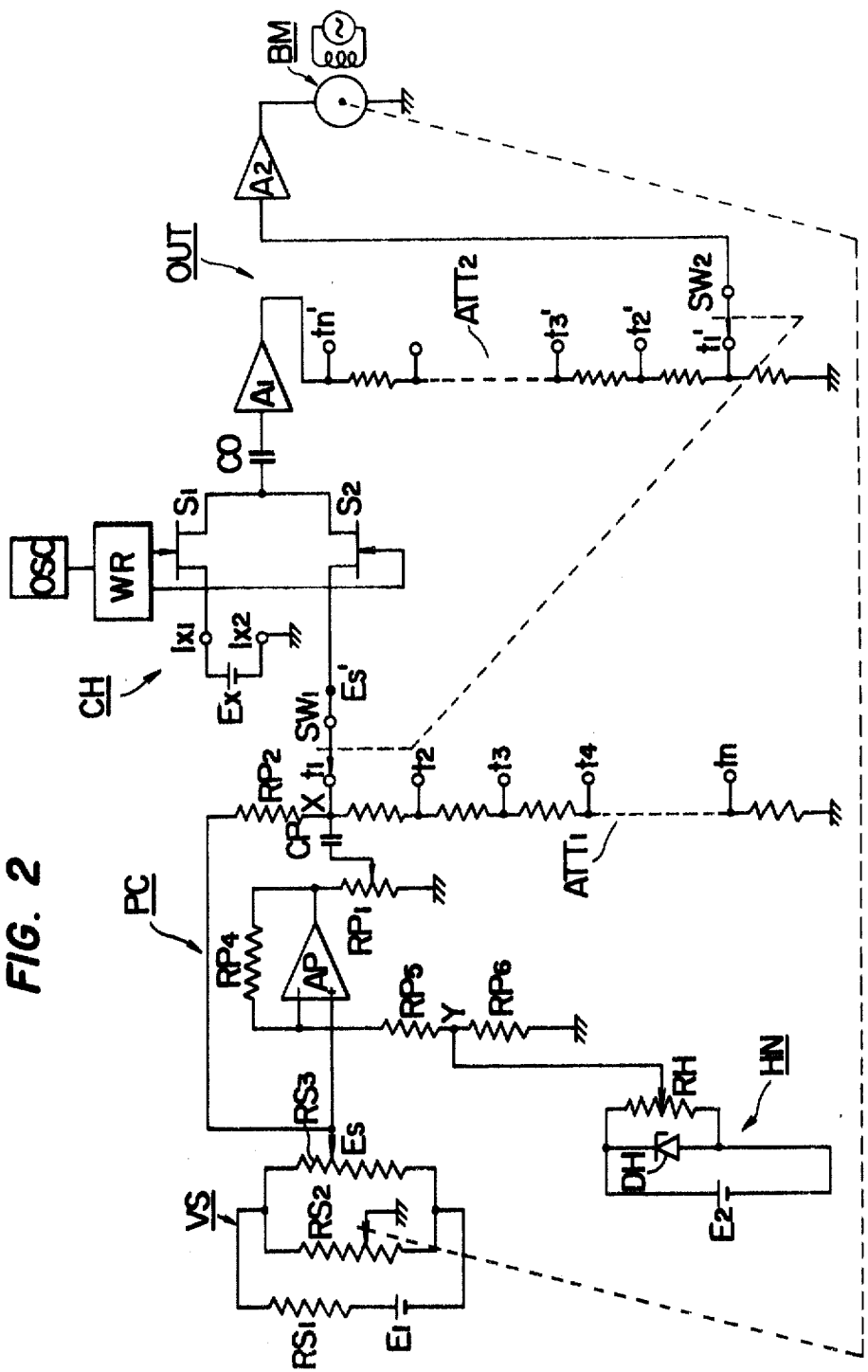
FIG. 2 is a circuit diagram depicting another illustrative embodiment of the invention.

Referring now to FIG. 2, a circuit diagram is shown to illustrate another illustrative embodiment of the invention. The white noise generator HN used in this embodiment is simpler in construction and lower in cost than that shown in FIG. 1. Although the arrangement of the phase compensating circuit PC is slightly different from that of the circuit PC shown in FIG. 1, the operation of this circuit is essentially the same as that of the circuit of FIG. 1, as described in reference to FIG. 6. In FIG. 2, the white noise generator NH comprises a Zener diode DH, a resistor RH, and a voltage source E2. The circuit elements are so determined that the Zener diode DH is operated in its electron avalanche region A shown in FIG. 3. The symbol PC indicates a phase compensating circuit, in which are disclosed a differential amplifier AP, and a variable resistor RP1 connected to the output terminal of the amplifier AP. A capacitor CP, similar to the one shown in FIG. 1, is connected to the brush of the variable resistor RP1. The non-inverting input terminal + of the amplifier AP is led to the brush of the variable resistor RS3. Also, the brush of the variable resistor RS3 is connected through a resistor RP2 to the junction X between the capacitor CP and the attenuator ATT1. A feedback resistor RP4 is connected between the output terminal and the inverting input terminal − of the amplifier AP, and resistors RP5 and RP6 are connected serially between the inverting input terminal + and the reference potential point. The brush of the resistor RH of white noise generator HN is connected to the junction Y between resistors RP5 and RP6. The other part of the circuit is the same as the corresponding parts of the circuit shown in FIG. 1.

The self-balancing apparatus of FIG. 2 is operated in the following manner. A voltage Es from the standard voltage generator VS is given a suitable phase lead by the phase compensating circuit PC and attenuated to a value corresponding to the range selected. The resultant voltage is applied to the control phase of the balancing motor BM by the way of the difference signal generator and DC-AC converter CH, and output circuit OUT. Concurrently, a white noise from the white noise generator HN is applied to the junction Y and amplified by the amplifier AP of the phase compensating circuit PC. The amplified output is applied as a dither to the balancing motor BM through the attenuators ATT1 and ATT2.

Compared with the embodiment of FIG. 1, this embodiment of FIG. 2 is advantageous in the following manner. The white noise produced by the white noise generator HN is amplified by the use of the amplifier AP which is a constituent element of the phase compensating circuit PC. This obviates the need for an additional amplifier in the white noise generator HN, as required in the embodiment of FIG. 1, with the result that the number of circuit elements is reduced and the overall instrument cost is reduced.

As described hereinabove, the invention offers a highly practical multi-range, self-balancing apparatus or instrument in which the dead zone is small and kept constant regardless of the range selected, and the phase can be efficiently adjusted by the use of an improved phase compensating circuit.

While few specific embodiments of the invention have been described, it is to be understood that this is for the purpose of illustrating the principles of the invention, and should not be construed to be necessarily limiting the scope of the invention.

What is claimed is:

1. A multi-range, self-balancing apparatus, comprising
   a. voltage generating means comprising a slide resistor having a movable brush and for generating an output standard voltage corresponding to the position of said brush;
   b. phase compensating means comprising is a voltage dividing circuit, a first capacitor and a non-inverting input amplifier having a variable amplification factor, said voltage dividing circuit comprising a resistor and a first range-changing attenuator to divide the output standard voltage of said voltage generating means, said output standard voltage being applied to said input amplifier and said amplifier providing an output signal through said first capacitor to the voltage dividing point of said voltage dividing circuit thereby to provide a phase compensated output signal;
   c. a difference signal generator and DC-AC converter means for converting the difference between said output signal from said phase compensating means and a measuring voltage, into an AC signal;
   (d) output means having a second range-changing attenuator for receiving said AC signal from said difference generator and DC-AC converter means and means for interlocking said second attenuator with said first attenuator whereby the product of the multiplication of the attenuation ratio of said first attenuator and the attenuation ratio of said second attenuator is constant, said output means supplying an output signal in accordance with the attenuation ratio of the said second attenuator;
   e. balancing motor means having a control phase and a shaft, said shaft being connected to said brush of said slide resistor of said voltage generating means, said output signal from said output means being applied to said control phase of said motor; and
   f. white noise generator means comprising a Zener diode and means for connecting the output terminals of said white generator to said phase compensating means, whereby said white noise output is superposed on said phase compensated output signal from said amplifier and thereafter operated upon by said difference generator and DC-AC converter means and said output means and subsequently applied to said motor means thereby to keep the dead zone small and constant for all ranges.

2. The apparatus of claim 1, wherein said output terminal of said white noise generator means is connected to the input terminal of said phase compensating means.

3. The apparatus of claim 1, wherein said output terminal of said white noise generator means is connected to the output terminal of said phase compensating means.

4. The apparatus of claim 2, wherein said white noise generator means comprises a Zener diode, a resistor and a DC voltage source, all connected to each other in parallel circuit configuration.

5. The apparatus of claim 3, wherein said white noise generator means comprises a Zener diode, a resistor connected in series with said Zener diode, a DC voltage source connected across said Zener diode and said series connected resistor, and a transistor having its base electrode connected to the junction between said Zener diode and said resistor, whereby the white noise produced by said Zener diode is amplified by said transistor and then applied to the output terminal fo said phase compensating means.

* * * * *